US006661229B2

United States Patent
Weyers et al.

(10) Patent No.: US 6,661,229 B2
(45) Date of Patent: Dec. 9, 2003

(54) RF BIRDCAGE COIL WITH REDUCED ACOUSTIC NOISE

(75) Inventors: Daniel J. Weyers, Wauwatosa, WI (US); Shizhe Li, Brookfield, WI (US); David E. Dean, Hartland, WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 110 days.

(21) Appl. No.: 09/845,594

(22) Filed: Apr. 30, 2001

(65) Prior Publication Data
US 2002/0158720 A1 Oct. 31, 2002

(51) Int. Cl.[7] ................................................ G01V 3/00
(52) U.S. Cl. ...................................................... 324/318
(58) Field of Search ................................. 324/318, 322, 324/307, 309, 311, 314, 320; 333/235

(56) References Cited

U.S. PATENT DOCUMENTS

| | | | |
|---|---|---|---|
| 4,783,641 A | | 11/1988 | Hayes et al. |
| 4,825,163 A | * | 4/1989 | Yabusaki et al. ............ 324/318 |
| 4,833,409 A | * | 5/1989 | Eash ............................ 324/318 |
| 5,245,285 A | * | 9/1993 | Ishizuka et al. ............. 324/318 |
| 5,990,681 A | * | 11/1999 | Richard et al. .............. 324/318 |
| 5,998,999 A | * | 12/1999 | Richard et al. .............. 324/318 |
| 6,150,816 A | * | 11/2000 | Srinivasan ................... 324/318 |
| 6,285,189 B1 | * | 9/2001 | Wong .......................... 324/318 |
| 6,288,540 B1 | * | 9/2001 | Chen et al. .................. 324/300 |
| 6,396,271 B1 | * | 5/2002 | Burl et al. ................... 324/307 |
| 6,404,201 B1 | * | 6/2002 | Boskamp ..................... 324/318 |

OTHER PUBLICATIONS

*Magnetic Resonance Imaging*, vol. 15, No. 7, Cho., Z.H., et al. "Analysis of Acoustic Noise in MRI," pp. 815–822, 1997.
*Magnetic Resonance in Medicine*, Hennel, F., et al. "Silent MRI With Soft Gradient Pulses." 42:6–10, 1999.

* cited by examiner

*Primary Examiner*—Diego Gutierrez
*Assistant Examiner*—Dixomara Vargas
(74) *Attorney, Agent, or Firm*—Quarles & Brady LLP; Carl Horton

(57) ABSTRACT

An RF birdcage coil for use in MRI systems is disclosed. A number of slotted or nonconductive channels are provided in the conductive material of the RF coil to minimize the size of the conductive paths available for eddy currents. Furthermore, blocking capacitors are applied between the legs and the end segments of the conductive elements to isolate the end segments from the legs at low frequency harmonics, such as those associated with eddy currents, while acting substantially as a short circuit at high operational frequencies. Preferably, the blocking capacitors are constructed by providing the legs of a plurality of I-beams on a first side of a dielectric material, and the end segments on an opposing side. The blocking capacitor results from overlapping the conductive material forming the leg and end segment on opposite sides of the dielectric material.

15 Claims, 3 Drawing Sheets

RF BIRDCAGE COIL WITH REDUCED ACOUSTIC NOISE

The present invention is related to nuclear magnetic resonance imaging, and more particularly to an NMR RF coil that reduces acoustic noise.

BACKGROUND

Magnetic Resonance Imaging (MRI) systems which use nuclear magnetic resonance to provide sectional images of a body are well known in the art. MRI systems basically comprise a main magnet for applying a static magnetic field; a plurality of gradient magnets, which are pulsed to select a layer or "slice" of a body to be imaged; and an RF coil which is applied to excite the atomic nuclei of hydrogen atoms in the body. In operation, a body to be examined is introduced into a strong, homogeneous, static magnetic field produced by the main magnet. This field causes alignment of nuclear spins of the atomic nuclei of hydrogen or other atoms in the body. After the nuclei are aligned, the RF coil is pulsed to excite precessional motion of the nuclei at a characteristic or Larmor frequency, and the gradient magnets are pulsed to select a layer or slice of the body for imaging. At the end of each radio frequency excitation pulse, the atomic nuclei initially precess and then settle back to a position determined by the applied static field. To generate an image, the RF signals from the nuclei are analyzed based on the spatial spin density or the distribution of the relaxation times in a layer or "slice" of the body as selected by the applied gradient fields.

MRI imaging has become a very important non-invasive medical analysis tool over the last twenty years. There are, however, a number of problems associated with the use of MRI in medical applications. The combination of high magnetic fields and gradient switching sequences, for example, results in induced magnetic forces that cause a significant amount of acoustic noise. The acoustic noise can cause discomfort to both the patient and medical personnel, and is therefore regulated by both FDA and OSHA regulations. Importantly, these regulations limit the pulse rates at which gradient magnets can be switched, thereby preventing important imaging techniques from being applied in medical imaging applications.

Although there are a number of sources of acoustic noise in an MRI system, one source has been traced to the RF coil. Typical RF coils are constructed as birdcage coils, such as the coil disclosed in U.S. Pat. No. 4,783,641. These birdcage coils comprise ladder-like resonant networks constructed of solid conductors. The conductors employed in these devices are generally selected to be relatively wide, in order to reduce the resistance in the coil. As the gradient coil is pulsed, a time varying magnetic field is applied to the conductors, and eddy currents develop in the conductive material. The eddy currents, in turn, induce a perpendicular Lorentz force in the coil which causes the coil to vibrate and produce acoustic noise on the coil cylinder. The wide conductors in the coil allow the circulating eddy currents to develop in relatively large loops, which therefore produce substantial Lorentz forces and acoustic noise in the system. While problematic in virtually any MRI system, these noise sources have become increasingly problematic as switching sequences have become more rapid.

There is a need, therefore, for an NMR RF birdcage coil for use in an MRI medical imaging system that produces a lower degree of acoustic noise as compared to prior art devices.

SUMMARY OF THE INVENTION

The present invention comprises a "quiet" RF birdcage coil, the coil comprising a plurality of I-shaped elements, wherein each I-shaped element includes a leg and first and second end segments. Successive I-shaped elements are electrically coupled together with tuning capacitors which provide resonant signals at selected frequencies. In the RF birdcage coil of the present invention, a number of steps are taken to reduce eddy currents in the conductors of the coil, thereby lowering the acoustic noise produced by the coil as compared to prior art devices. A number of slotted or non-conductive channels can be provided in the conductive material of the RF coil to minimize the size of the conductive paths available for eddy currents. Furthermore, blocking capacitors can be applied between the legs and the end segments of the I-shaped elements to isolate the end segments from the legs at low frequency harmonics, such as those associated with gradient induced eddy currents, while acting substantially as a short circuit at high operational frequencies. At low frequencies, therefore, the conductive area in which eddy current loops can flow is again reduced, while operation remains substantially the same at high frequencies. Preferably, the blocking capacitors are constructed by providing the legs of each I-beam on a first side of a dielectric material, and the end segments on an opposing side. The blocking capacitor results from overlapping the conductive material forming the leg and end segment on opposite sides of the dielectric material, thereby minimizing the number of parts and increasing reliability of the coil.

These and other objects, advantages and aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefor, to the claims herein for interpreting the scope of the invention.

BRIEF DESCRIPTION OF THE DRAWINGS

FIG. 4 is a detailed view of a leg of FIG. 2a.

DETAILED DESCRIPTION OF THE INVENTION

Figure 1:
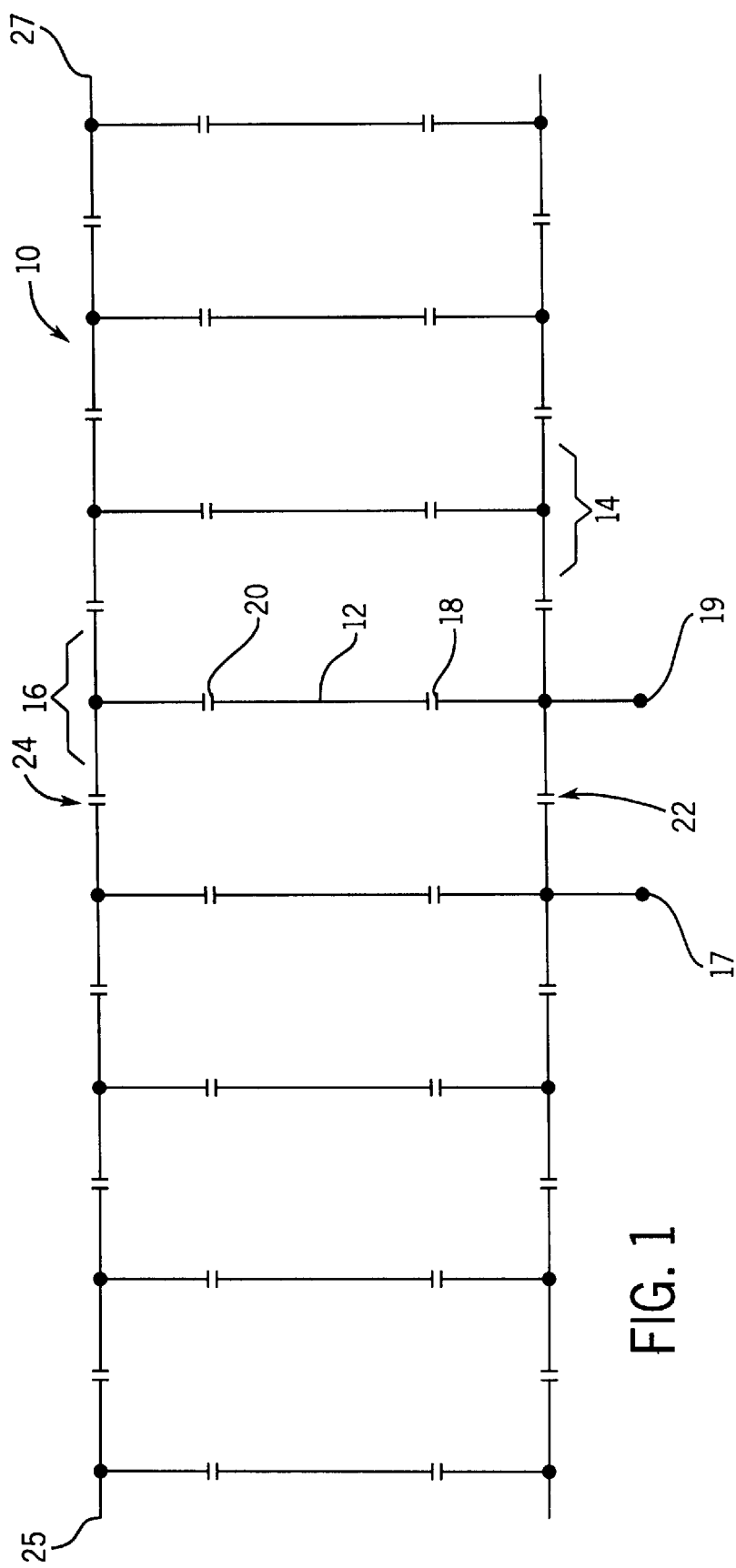
FIG. 1 is a circuit diagram of an RF coil constructed in accordance with the present invention.

Referring now to the Figures and more particularly to FIG. 1, a circuit diagram of an RF birdcage coil 10 constructed in accordance with the present invention is shown. The RF birdcage coil 10 comprises a plurality of legs 12, a first plurality of end segments 14 and a second plurality of end segments 16, where each of the plurality of first end segments 14 and second end segments 16 form a ring. Each leg 12 is electrically coupled to one of the first plurality of end segments 14 through a blocking capacitor 18 and to one of the second plurality of end segments 16 through a blocking capacitor 20. Successive first end segments 14 and successive second end segments 16 are electrically coupled together through one or more tuning capacitor 22 and 24, respectively. A pair of input/output terminals 17 and 19 are coupled across one of the tuning capacitors 22 or 24 to excite the RF coil 10 at a resonant frequency. When excited at a resonant frequency, the blocking capacitors act substantially as short circuits, and the RF coil 10 carries a current that can be modeled as a standing wave on a transmission line. Thus, in operation, the RF coil 10 has a substantially sinusoidally weighted current distribution between the legs 12 or inductive "rungs" of the ladder circuit, as is known in the art with respect to prior art high pass RF birdcage coils. Although the circuit is shown in a flat configuration, in operation the opposing ends 25 and 27 are electrically coupled to form a ring. Furthermore, although a circuit comprising seven legs 12 is shown, the number of legs can vary dependent on design choice. Preferably, the number of legs 12 is sixteen of described below.

Figure 2A:
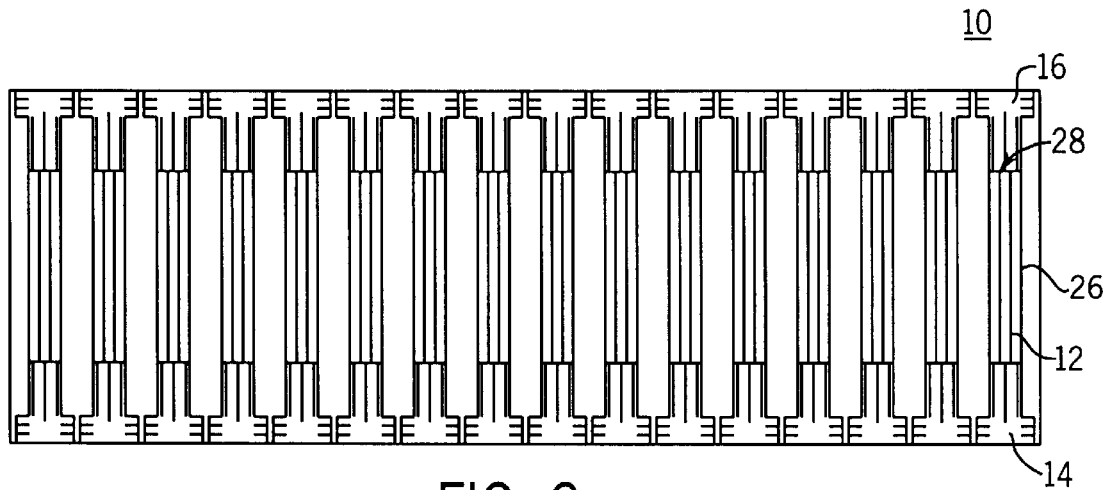
FIG. 2a is a top view of an RF coil constructed in accordance with one embodiment of the present invention.
Figure 2B:
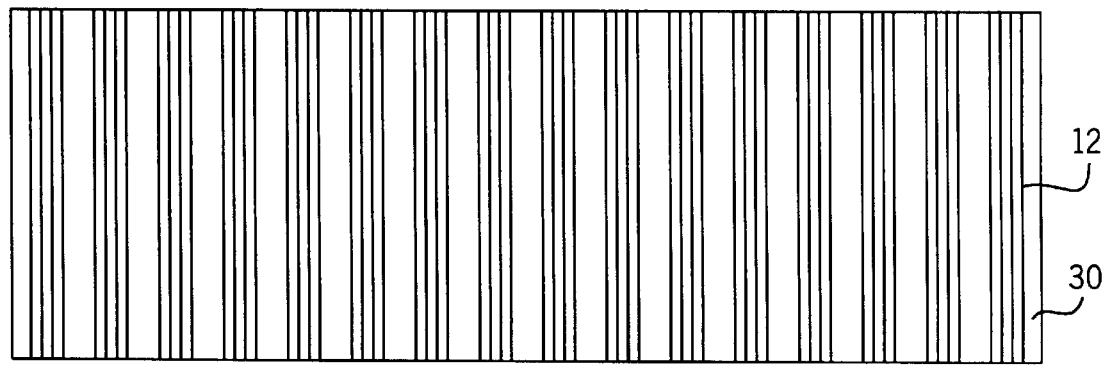
FIG. 2b is a bottom view of an RF coil constructed in accordance with one embodiment of the present invention.
Figure 2C:
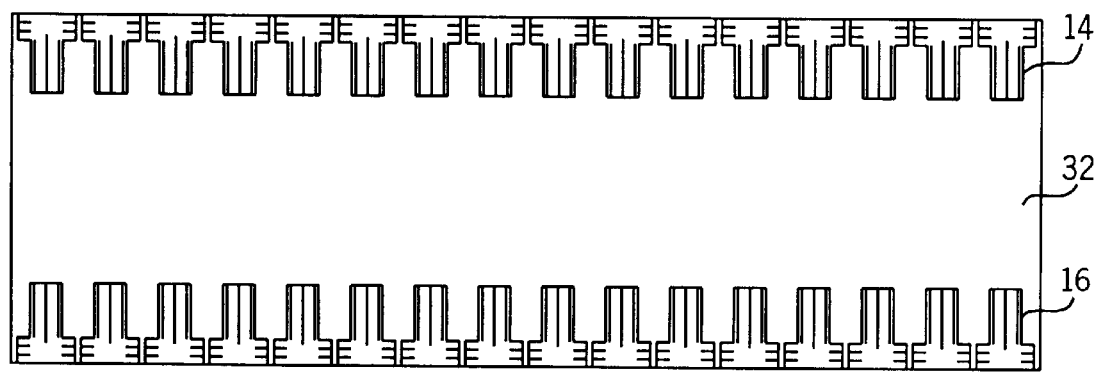
FIG. 2c is a top view of an RF coil constructed in accordance with one embodiment of the present invetion.

Referring now to FIG. 2a, an RF birdcage coil 10 constructed in accordance with the present invention is shown. The coil 10 comprises a support 26, preferably comprising a dielectric material, and a plurality of I-beam elements 28, each comprising a conductive material. The support 26 is preferably in the shape of a cylindrical tube, with the I-beam elements 28 being arranged substantially in parallel around the cylindrical tube. Each of the I-beam elements 28 comprises a leg 12 coupled at one end to a first end segment 14 and at a second end to a second end segment 16, such that the leg 12 is substantially perpendicular to each of the first and second end segments 14 and 16, respectively. Referring now to FIGS. 2b and 2c, the legs 12 are preferably formed on a first side 30 of the support 26 and the end segments 14 and 16 are formed on a second side 32 of the support 26 such that at least a portion of each of the legs 12 overlaps a portion of each of the end segments 14 and 16, with a portion of the support 26 sandwiched between the legs 12 and end segments 14 and 16. The support 26 is composed of a dielectric material such that the overlap regions 21 and 23 form the blocking capacitors 18 and 20 of FIG. 1, respectively. To reduce vibrations, the RF coil 10 can be coated with a layer of damping material (not shown).

Figure 3:
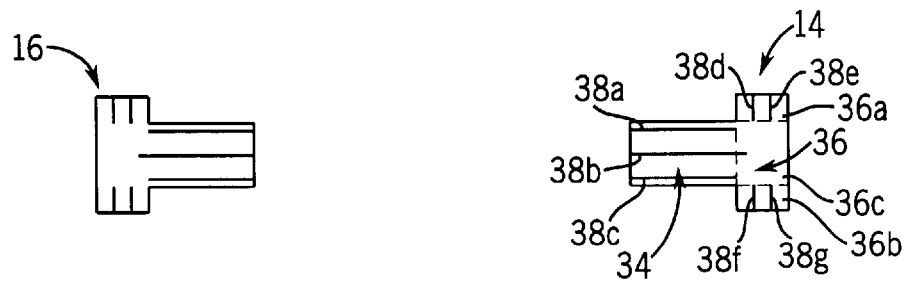
FIG. 3 is a detailed view of the first and second end segments of FIG. 2b.

Referring now to FIG. 3, an end segment 14 and an end segment 16 are shown in detail, as formed in a diametrically opposed configuration on the second side 32 of the support 26. The end segments 14 and 16 are preferably T-shaped elements, comprised of a conductive material. Each T-shaped end segment 14 and 16 includes a base section 34 and a head section 36. The base section 34 and head section 36 preferably each include one or more "slots" or slotted channels 38 cut into the conductive material in the direction of current flow through the coil 10. Preferably, each of the head and base sections includes a plurality of parallel slotted channels 38, such that the slotted channels divide current flow through the conductive material in each of the legs 12 and end segments 14 and 16 and prevent large current paths for eddy currents. In a preferred embodiment, the base section 34 of each T-shaped end segment includes three parallel slotted channels 38a, 38b, and 38c, which extend longitudinally along the length of the base section 34. The three slotted channels 38a, 38b, and 38c divide the base section 34 into four current paths. Preferably, the slotted channels 38a, 38b, and 38c are spaced in the base section 34 such that the two outermost current paths are relatively narrow as compares to the two inner current paths, thereby promoting internal current flow. The head section 36 comprises a left section 36a, a right section 36b, and a middle section 36c. Each of the left and right sections 36a and 36b, respectively, includes two slotted channels, designated 38d, 38e, 38f, and 38g. The slotted channels 38d and 38e are spaced at substantially equivalent intervals through the conductive material in the left section, and the slotted channels 38f and 38g are spaced at substantially equivalent intervals through the conductive material in the right section. The slotted channels 38 extend laterally across the head section 36, and preferably extend only along a portion of the length of the head section 36 such that the middle section 36a comprises a solid conductive material as shown. In some applications, the middle section 36a can also include slotted channels 38.

Figure 4:
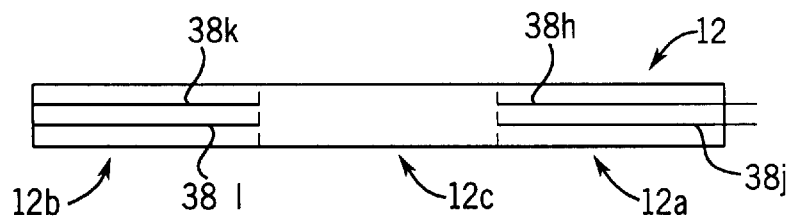
Figure 5:
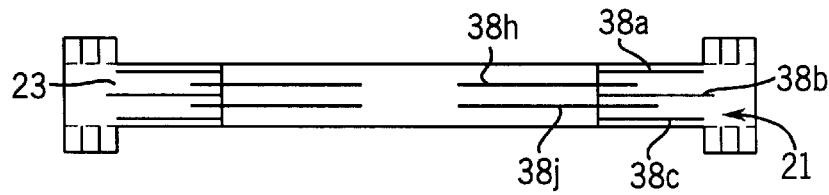
FIG. 5 is a detailed view of an I-shaped beam comprising the end segments of FIG. 3 and the leg of FIG. 4.
Figure 6:
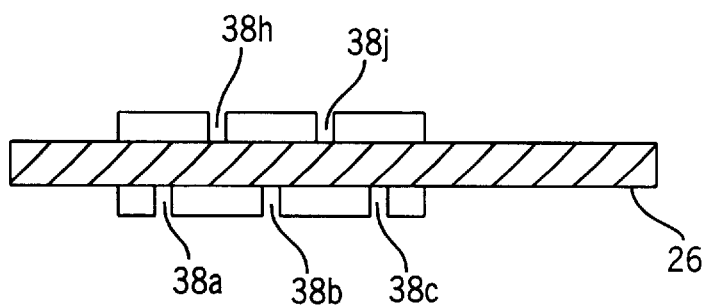
FIG. 6 is a cutaway view of the I-shaped beam of FIG. 5.

Referring now to FIG. 4, a detailed view of a leg 12 is shown. The leg 12 comprises a substantially rectangular section of conductive material which is dimensioned to extend from one of the first plurality of end segments 14 to an opposing one of the second plurality of end segments 16, such that the leg 12 overlaps at least a portion of each of the end segments 14 and 16 in the overlapping regions 21 and 23. The leg 12 preferably includes at least one, and preferably a plurality of slotted channels 38, where the slotted channels are again spaced at substantially equivalent intervals through the conductive material to divide current flow through the conductors and to limit the path of eddy currents in the conductive material. The slotted channels 38 extend longitudinally along the length of the leg 12, and can extend across the entire length of the leg 12. In a preferred embodiment, however, the leg 12 comprises three sections: a top section 12a, a bottom section 12b, and a middle section 12c. Referring now also to FIGS. 5 and 6, the top section 12a includes two slotted channels 38h and 38j, the slotted channels 38h and 38j being positioned in the leg 12 such that, when the leg 12 overlaps the base 26 of the end segment 14, the slotted channel 38h is substantially centered between the slotted channels 38a and 38b of the end segment 14, and the slotted channel 38j is substantially centered between the slotted channels 38b and 38c of the end segment 14. The bottom section 12b similarly includes two slotted channels 38k and 38l which are positioned in the conductive material such that the slotted channels in the leg 12 are offset from those in the end segment 16. The offset slotted channels 38 positioned in the overlap regions 21 and 23 have the effect of providing a plurality of capacitors electrically coupled in series to form the blocking capacitors 18 and 20, thereby providing a relatively large capacitance value in a relatively small space.

As noted above, a typical MRI system includes a main magnet for applying a static magnetic field to the body, and three gradient magnets for applying a gradient field in each of three Cartesian coordinates, x, y, and z, respectively. The MRI system further comprises associated hardware and software for applying and pulsing magnetic and RF fields, in a manner known to those of skill in the art. During an imaging scan, the RF coil 10 is coupled around a body to be imaged. The body and associated RF coil 10 are subjected to a static magnetic field supplied by the main magnet, which causes alignment of nuclear spins of the atomic nuclei of hydrogen atoms in the body. The RF coil 10 is pulsed at a resonant frequency to provide RF excitation pulses to the body which effect precessional motion of the atomic nuclei at the characteristic Larmor frequency. As the excitation pulses are applied, linear field gradients are used to assign the nuclear resonance signal to the location where it originated. For this purpose, the gradient magnets are pulsed to superpose an additional magnetic field on the static background field. Therefore, while an image is being scanned, the RF coil 10 is subject to a time varying magnetic field produced by the pulsed gradient magnets. The time varying magnetic field induces low frequency or dc eddy currents into the conductors of the RF coil 10.

Referring again to FIG. 1, the blocking capacitors 18 and 20 are sized to act substantially as an open circuit to low frequency or dc harmonics provided by the induced eddy currents. To low frequency harmonics, therefore, the legs 12 are substantially decoupled or isolated from the associated end segments 14 and 16 through the blocking capacitors 18 and 20, respectively. The blocking capacitors 18 and 20 therefore limit the conductive area in which eddy currents can flow to the leg 12 or an end segment 14 or 16. Referring again to FIGS. 3 and 4, the slotted channels 38 provided in each of the legs 12 and end segments 14 and 16 further limit the potential eddy current flow path by dividing the conductive material into a number of discrete conductive elements separated by nonconductive slots. Both the blocking capacitors 18 and 20 and the slotted channels 38 therefore reduce the effective low frequency conducting area of the RF coil 10. The reduced conductive area in turn reduces the magnitude of eddy currents induced in the conductive material of the RF coil 10, thereby reducing the magnitude of the Lorentz forces generated in the RF coil 10, and reducing acoustic noise produced in the RF coil.

At high frequencies, and particularly for applied harmonics at the resonant frequencies at which the RF coil 10 is operated, the blocking capacitors 18 and 20 provide only a low impedance reactance. Furthermore, at high frequencies, inductive coupling between the conductors separated by the slotted channels 38 make the conductors appear substantially as solid conductors. When operated at high frequencies, therefore, the RF coil 10 of the present invention responds in substantially the same way as a prior art high pass birdcage coil.

Although the RF coil 10 of the present invention can be constructed to operate in a number of known MRI systems, an example is provided for an RF coil 10 constructed to operate in a magnetic field produced by a main magnet having a magnetic strength of 1.5T. The RF coil 10 in this embodiment comprises sixteen legs 12, sixteen end segments 14, and sixteen end segments 16. The slotted channels 38 in each of the legs 12 are substantially 0.5 mm in width, while those in the end segments 14 and 16 are substantially 1.0 mm wide. The legs 12 and end segments 14 and 16 comprise a copper material, although it will be apparent that a number of different conductive materials could be applied. The support 26 preferably comprises a low loss dielectric material such as teflon fiberglass, G-Tech FR4, or other low loss dielectric materials known to those of skill in the art. For this applied magnetic field, the Larmor frequency, and hence the frequency at which the RF coil 10 is operated, is 64 MHz. The overlap areas 21 and 23 are each dimensioned to be approximately eighty square centimeters, and the width of the support 26 to be approximately 0.1 mm such that the blocking capacitors 18 and 20 each have a capacitance value of substantially 3 nF. The associated impedance of the blocking capacitors is therefore in a range of under one ohm. The impedance value of the blocking capacitors 18 and 20 when operated at 64 MHz is less than one ohm, and therefore substantially simulates a short circuit at high frequencies. At low frequencies, and particularly for eddy currents which typically oscillate at a frequency of 10 KHz or less, the blocking capacitors 18 and 20 substantially isolate the end segments 14 and 16 from the legs 12.

It should be understood that the methods and apparatuses described above are only exemplary and do not limit the scope of the invention, and that various modifications could be made by those skilled in the art that would fall under the scope of the invention. Although an exemplar embodiment has been shown in which a number of steps to reduce eddy currents and acoustic noise have been combined, it will be apparent that noise can also be reduced by applying these steps independently. For example, an RF coil which includes slotted channels as described above can be applied to reduce acoustic noise as compared to prior art devices irrespective of the existence of blocking capacitors, and irrespective of whether the I-shaped element is formed on a single side of a support, or on multiple sides as shown. Likewise, an RF coil constructed of a solid conductive material but including blocking reactors between the legs and end segments can also reduce acoustic noise. The blocking capacitors can be constructed through the use of overlapping conductive material, as described above, or can comprise discrete capacitive elements coupled between the legs and end segments of a coil. Additionally, an RF coil constructed in accordance with the present invention can be constructed in a variety of shapes and using a variety of materials. Although T-shaped end segments have been shown, it will be apparent that square, rectangular, and other end segment shapes could be applied. Furthermore, although the legs and end segments have been described as having slots or slotted channels cut therein, it will be apparent that a similar effect can be achieved by providing separate parallel conductive strips or wires. Other revisions and modifications within the scope of the invention will be apparent to those of skill in the art.

To apprise the public of the scope of this invention, the following claims are made:

We claim:

1. An RF coil comprising:

a plurality of conductive legs, successive conductive legs being arranged parallel to each other and to a longitudinal axis on a support extending from a first end to a second end, each of the legs including at least one longitudinal slotted channel;

a first plurality of end segments, each of the first plurality of end segments being arranged substantially perpendicular to the first end of one of the plurality of legs, and each of the first plurality of end segments including at least one lateral slotted channel extending in a direction substantially perpendicular to the longitudinal slotted channels in the plurality of legs;

a second plurality of end segments, each of the second plurality of end segments being arranged substantially perpendicular to the second end of one of the plurality of legs, and each of the second plurality of end segments including at least one lateral slotted channel extending in a direction substantially perpendicular to the longitudinal slotted channel in the plurality of legs; and a plurality of tuning capacitors, wherein each of the first plurality of end segments is coupled to another of the first plurality of end segments with a tuning capacitor, each of the second plurality of end segments is coupled to another of the second plurality of end segments with a tuning capacitor, and each of the legs is electrically coupled to the substantially perpendicular one of the first plurality of end segments and to the substantially perpendicular one of the second plurality of end segments.

2. The RF coil as defined in claim 1, wherein the support comprises a dielectric material including a top side and a bottom side, and each of the plurality of legs is disposed on the bottom side of the support and each of the plurality of first and second end segments are disposed on the top side of the support.

3. The RF coil as defined in claim 2, wherein each of the end segments on the top of the support is aligned over at least a portion of the leg on the bottom of the support to form first and second capacitive overlap regions.

4. The RE coil as defined in claim 3, wherein the portion of the leg and the portion of the first and second end segments in each of the capacitive first and second overlap regions includes at least one longitudinally slotted channel, the longitudinally slotted channel in the leg being laterally offset from the longitudinally slotted channels in the first and second end segments.

5. The RF coil as defined in claim 4, wherein each of the end segments comprises a T-shaped conductive element including a base and a head element, and the base of each of the T-shaped end segments is aligned over at least a portion of the leg to form the first and second capacitive overlap regions.

6. An RF coil comprising:
a plurality of conductive legs, successive conductive legs being arranged parallel to each other and to a longitudinal axis on a support extending from a first end to a second end, each of the legs including a plurality of longitudinal slotted channels;
a first plurality of end segments, each of the first plurality of end segments comprising a T-shaped conductive element including a base and a head element, and the base of each of the T-shaped end segments is aligned over at least a portion of the first end of the leg to form a first capacitive overlap regions;
a second plurality of end segments, each of the second plurality of end segments comprising a T-shaped conductive element including a base and a head element, the base of each of the second plurality of T-shaped end segments being aligned over at least a portion of the second end of the leg to form a second capacitive overlap region; and
a plurality of tuning capacitors, wherein each of the first plurality of end segments is coupled to another of the first plurality of end segments with a tuning capacitor and each of the second plurality of end segments being coupled to another of the second plurality of end segments with a tuning capacitor, wherein the head of each of the first and second plurality of T-shaped conductive element includes a left, a right, and a middle section, the middle section being substantially contiguous with the base, and the base includes first, second, and third longitudinally slotted channels and each of the right and left sections include first and second lateral slotted channels, each of the first, second, and third longitudinally slotted channels being substantially parallel to each other and each of the first and second lateral slotted channels being substantially parallel to each other.

7. The RF coil as defined in claim 6, wherein each leg comprises:
a top section, a bottom section and a middle section; and
a first, a second, a third, and a fourth longitudinal slotted channel, the first and second longitudinal channels being located in the top section of the leg, and the third and fourth longitudinal channels being located in a bottom half of the leg, wherein the first longitudinal channel of the leg is substantially centered between the first and second longitudinal channels of the base of the corresponding first T-shaped end segment, the second longitudinal channel is substantially centered between the second and third longitudinal channels of the first T-shaped end segment, the third longitudinal channel is substantially centered between the first and second longitudinal channels of the second T-shaped end segment, and the fourth longitudinal slotted channel is substantially centered between the second and third longitudinal channels of the second T-shaped end segment.

8. An RF coil, comprising:
a first end ring comprising a first plurality of T-shaped end segments;
a second end ring comprising a second plurality of T-shaped end segments; and
a plurality of legs, separate from the T-shaped end segments, each of the plurality of legs extending substantially from the first end ring to the second end ring, wherein each of the T-shaped end segments and each of the legs comprises at least one slot.

9. The RF coil as defined in claim 8, wherein each of the first plurality of T-shaped end segments is connected to another of the first plurality of T-shaped end segments through a tuning capacitor, and each of the second plurality of T-shape or end signals is coupled to another of the second plurality of end signals through a timing compactor.

10. The RF coil as defined in claim 8, wherein a portion of each of the T-shaped end segment overlaps a portion of one of the legs to provide a capacitive region.

11. A RF coil, comprising:
a plurality of legs, each of the plurality of legs having a first end and a second end;
a plurality of slots provided in each of the legs, each of the slots extending substantially from the first end to the second end of a respective leg;
a plurality of T-shaped end segments, one of the T-shaped end segments being provided at each of the first and the second ends of each of the plurality of legs; and
a plurality of slots formed in each of the T-shaped end segments.

12. The birdcage coil as defined in claim 11, wherein the plurality of slots formed in the T-shaped end segment comprises at least one horizontal slot provided in a head of the T-shaped end segment and at least one vertical slot provided in the base of the T-shaped end segment.

13. A RF coil, comprising:
a tubular substrate;
a plurality of legs fixed on the tubular substrate, each of the legs comprising at least one slot extending selectively from a first end of the leg to a second end of the leg;
a plurality of T-shaped end segments fixed on the tubular substrate, one of the plurality of T-shaped end segments being provided at each of the first and second ends of the plurality of legs, and each of the plurality of end segments comprising at least one slot.

14. The RF coil as defined in claim 13, wherein the plurality of legs are fixed on a first side of the substrate or on the plurality of T-shaped end segments and fixed on a second side of the substrate.

15. The RF coil as defined in claim 14, wherein at least a portion of each T-shaped end segment overlaps a portion of one of the legs to form a capacitor overlap region.

* * * * *

UNITED STATES PATENT AND TRADEMARK OFFICE
CERTIFICATE OF CORRECTION

PATENT NO. : 6,661,229 B2 Page 1 of 1
DATED : December 9, 2003
INVENTOR(S) : Daniel J. Weyers et al.

It is certified that error appears in the above-identified patent and that said Letters Patent is hereby corrected as shown below:

Column 7,
Line 11, "RE" should be -- RF --.

Signed and Sealed this

Thirteenth Day of April, 2004

JON W. DUDAS
*Acting Director of the United States Patent and Trademark Office*